(12) United States Patent
Robinson et al.

(10) Patent No.: US 7,034,614 B2
(45) Date of Patent: *Apr. 25, 2006

(54) MODIFIED POLAR AMPLIFIER ARCHITECTURE

(75) Inventors: Ian Robinson, Venice, CA (US); Frank Winter, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 41 days.

This patent is subject to a terminal disclaimer.

(21) Appl. No.: 10/719,514

(22) Filed: Nov. 21, 2003

(65) Prior Publication Data

US 2005/0110568 A1  May 26, 2005

(51) Int. Cl.
*H03F 1/00* (2006.01)

(52) U.S. Cl. .................................. 330/151; 330/136

(58) Field of Classification Search ............... 330/151, 330/136, 129, 124 R, 51, 295
See application file for complete search history.

(56) References Cited

U.S. PATENT DOCUMENTS

| | | | | |
|---|---|---|---|---|
| 6,043,707 A | * | 3/2000 | Budnik | .................. 330/10 |
| 6,097,252 A | * | 8/2000 | Sigmon et al. | ............. 330/136 |
| 6,107,880 A | * | 8/2000 | Shaw | ..................... 330/136 |
| 6,175,273 B1 | | 1/2001 | Sigmon et al. | |
| 6,242,975 B1 | | 6/2001 | Eidson et al. | |
| 6,252,461 B1 | | 6/2001 | Raab | |
| 6,255,906 B1 | | 7/2001 | Eidson et al. | |
| 6,266,517 B1 | | 7/2001 | Fitzpatrick et al. | |
| 6,486,733 B1 | | 11/2002 | Myers et al. | |
| 6,552,634 B1 | | 4/2003 | Raab | |
| 6,813,319 B1 | * | 11/2004 | Nagle et al. | ................ 375/302 |
| 6,822,523 B1 | * | 11/2004 | Grosspietsch et al. | ...... 332/149 |
| 6,931,240 B1 | * | 8/2005 | Hunton | ..................... 455/130 |
| 2003/0112063 A1 | | 6/2003 | Kenington | |

OTHER PUBLICATIONS

F.H. Raab, et al., "High-Efficiency L-Band Kahn-Technique Transmitter", IEEE MTT-S Digest, 1998, p. 585-588.
D. Rudolph, "Kahn EER Technique With Single-Carrier Digital Modulations", IEEE Transactions on Microwave Theory and Techniques, vol. 51, No. 2, Feb. 2003, p. 548-552.
International Search Report for corresponding PCT/US2004/038995, completed Apr. 11, 2005 by G. Fedi.

* cited by examiner

*Primary Examiner*—Henry Choe
(74) *Attorney, Agent, or Firm*—Tarolli, Sundheim, Covell & Tummino L.L.P.

(57) ABSTRACT

An amplifier system is provided that switches between operation in a polar mode and a signal restoration mode based on a characteristic of an input signal relative to a threshold level. The system includes a correction path that mitigates distortion and out-of-band (OOB) emissions in the polar mode and provides at least a substantial portion of the amplified output signal in the signal restoration.

29 Claims, 5 Drawing Sheets

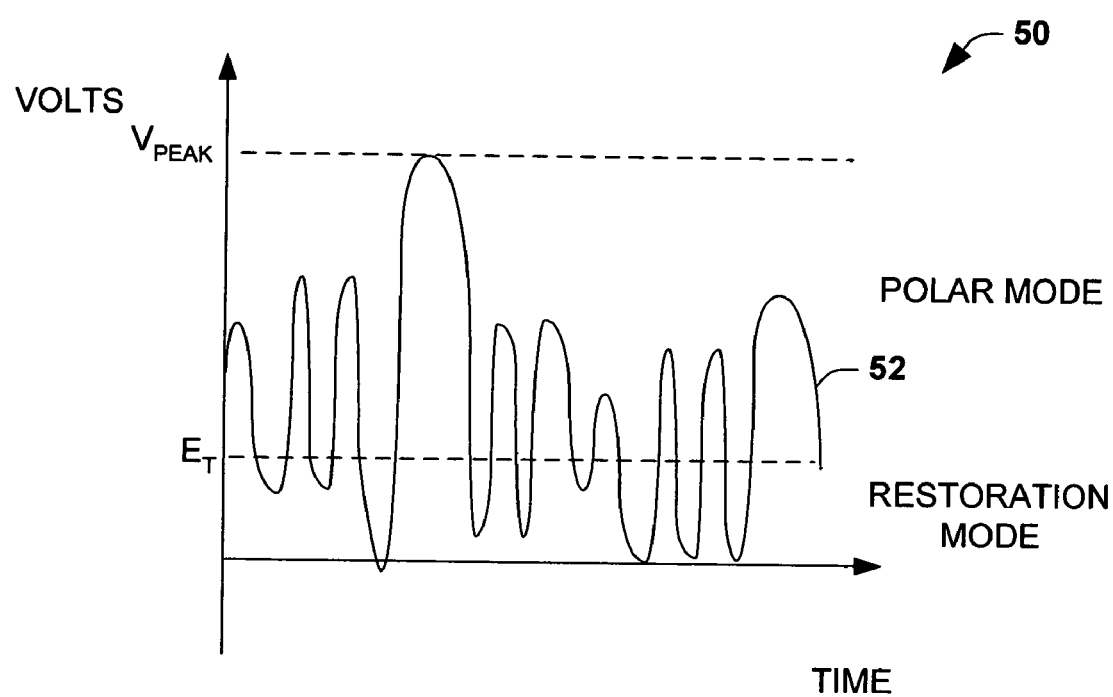
FIG. 2
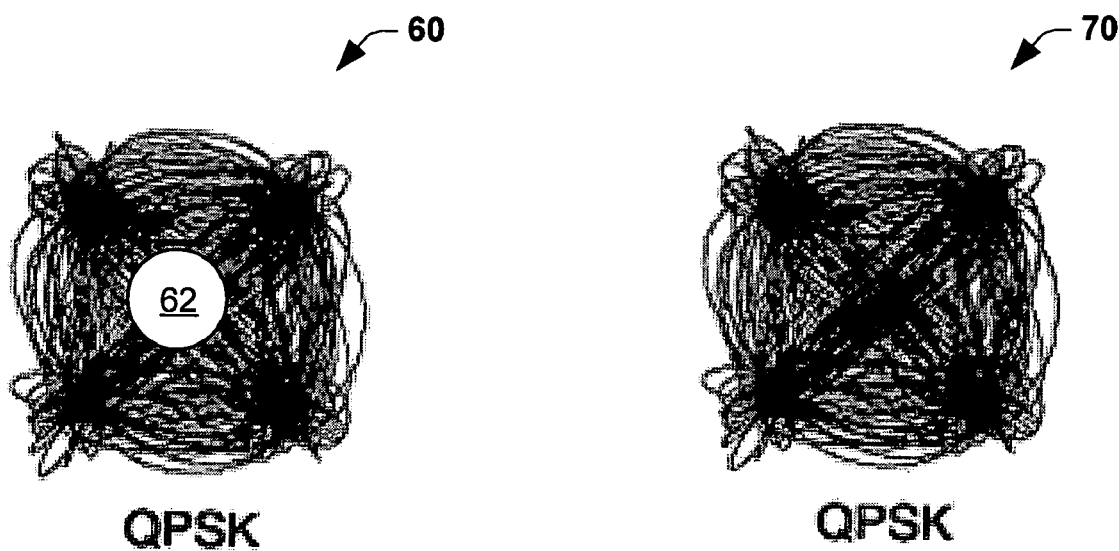
FIG. 3   FIG. 4

MODIFIED POLAR AMPLIFIER ARCHITECTURE

CROSS REFERENCE TO RELATED APPLICATIONS

The present application is related to New Robinson U.S. Patent Application entitled "MULTIPLE POLAR AMPLIFIER ARCHITECTURE", Filed Nov. 21, 2003, Ser. No. 10/719,513, assigned to the same assignee as the present application.

TECHNICAL FIELD

The present invention relates generally to electronic devices, and more particularly to a modified polar amplifier architecture.

BACKGROUND OF THE INVENTION

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacturing and operation.

Non-linear classes (e.g., Class C, D, E and F type amplifiers) of RF power amplifiers switch the RF devices on and off in or near saturation, and are more efficient than linear classes of operation such as Class-A, Class-AB or Class-B type which conduct during at least half of the RF cycle and are significantly backed off from saturation, generally avoiding the region of operation where the gain is compressed. However, non-linear amplifiers can only be employed with constant envelope signals, such as frequency modulations (FM) and certain forms of phase modulation (PM), signals with modulated amplitudes cause severely distorted outputs from these classes of amplifiers.

One efficiency enhancement technique that has been employed is known as the Kahn or Envelope Elimination and Restoration (EER) technique. The EER technique detects the envelope of the incoming signal to produce a baseband amplitude modulated (AM) signal. The EER technique limits the input signal to produce a phase modulated (PM) component with a constant envelope. The PM signal is provided to the input of the power amplifier along a PM path and the amplitude modulated component is employed to modulate the supply of the power amplifier along an AM path. Amplitude modulation of the supply terminal of the final RF power amplifier restores the envelope to the phase-modulated carrier, creating an amplified version of the input signal. Since the signal input into the power amplifier has a constant envelope amplitude, a more efficient class of power amplifier (e.g., Class-C type amplifiers) can be employed to amplify the input signal. Additionally, since the supply signal is amplitude modulated, the amplifier is operating at saturation enhancing the efficiency of the amplifier.

Amplifiers that employ the EER technique are referred to as polar amplifiers. Polar amplifiers have demonstrated very high efficiency but can distort signals and cause significant amounts of OOB emissions. Most available linearization techniques are not applicable to polar amplifiers because of their dual signal nature, making it difficult to reduce OOB emissions. Traditional implementations require the two signal paths (AM and PM) to be extremely well synchronized. The two paths may each require substantially wider bandwidth components than the original signal. If the signal crosses through a zero-amplitude point, referred to as zero crossings, it may cause the polar amplifier to cut-off and/or require an extremely rapid and difficult phase change in the constant envelope phase modulated path. If the signal varies over a large dynamic range it may cause the polar amplifier to operate with very low supply (e.g., drain) voltages resulting in additional signal distortion and can cause the amplifier to shutoff when the supply voltage becomes too low. As a result, the polar amplifier has only been employed with a limited range of waveforms. In traditional EER systems, OOB emissions have been controlled by calibrating the delay along the two paths to synchronize the reconstitution of the signal and by detecting the envelope of the output and supplying feedback to the path amplifying the envelope (the AM path).

SUMMARY OF THE INVENTION

The present invention relates to an amplifier system that switches between operation in a polar mode and a signal restoration mode based on a characteristic of an input signal relative to a threshold level (e.g., envelope amplitude threshold level, digital count representation of signal level, power amplifier power level or the like). In one aspect of the invention, an amplifier system is provided that includes a power amplifier and a mode selector. The power amplifier is operative to amplify an input signal to provide an amplified output signal. The mode selector controls the operation of the amplifier system between a polar mode and a signal restoration mode based on a characteristic of the input signal relative to a threshold level.

In another aspect of the invention, an amplifier system is provided that includes a power amplifier, an input path, a supply path, a mode selector and a correction path. The power amplifier is operative to amplify an input signal to provide an amplified output signal. The input path is coupled to an input of the power amplifier and the supply path is coupled to a supply of the power amplifier. The mode selector controls the operation of the amplifier system between a polar mode and a signal restoration mode based on an envelope amplitude level of the input signal relative to a threshold level. The correction path mitigates signal distortion and out-of-band (OOB) emissions associated with the amplified output signal in the polar mode and provides at least a substantial portion of the amplified output signal in the signal restoration mode.

In yet another aspect of the present invention, a method of amplifying an input signal with a power amplifier is provided. The method includes switching a power amplifier between a polar mode operation and a signal restoration mode operation based on a characteristic of the input signal relative to a threshold level. A phase modulated component of the input signal is transmitted to an input terminal of a power amplifier and the accordant amplitude modulated component of the input signal is transmitted to a supply terminal of the power amplifier during polar mode operation. The method includes transmitting one of a composite signal component, a phase modulated component, a substantially constant amplitude signal and no signal to the input terminal of the power amplifier and a substantially constant amplitude signal to the supply terminal during the signal restoration mode operation. The input signal is amplified via the power amplifier while continuously switching modes between polar mode operation and signal mode operation to provide an amplified output signal. A signal correction is performed on the amplified output signal.

BRIEF DESCRIPTION OF THE DRAWINGS

FIG. 2 illustrates a graph of voltage versus time of an exemplary input signal.

FIG. 3 illustrates a vector diagram of a quadrature phase-shift keying (QPSK) digital modulation scheme for a polar amplifier output without signal restoration.

FIG. 4 illustrates a vector diagram of a quadrature phase-shift keying (QPSK) digital modulation scheme for a polar amplifier output with signal restoration.

DETAILED DESCRIPTION OF INVENTION

Figure 1:
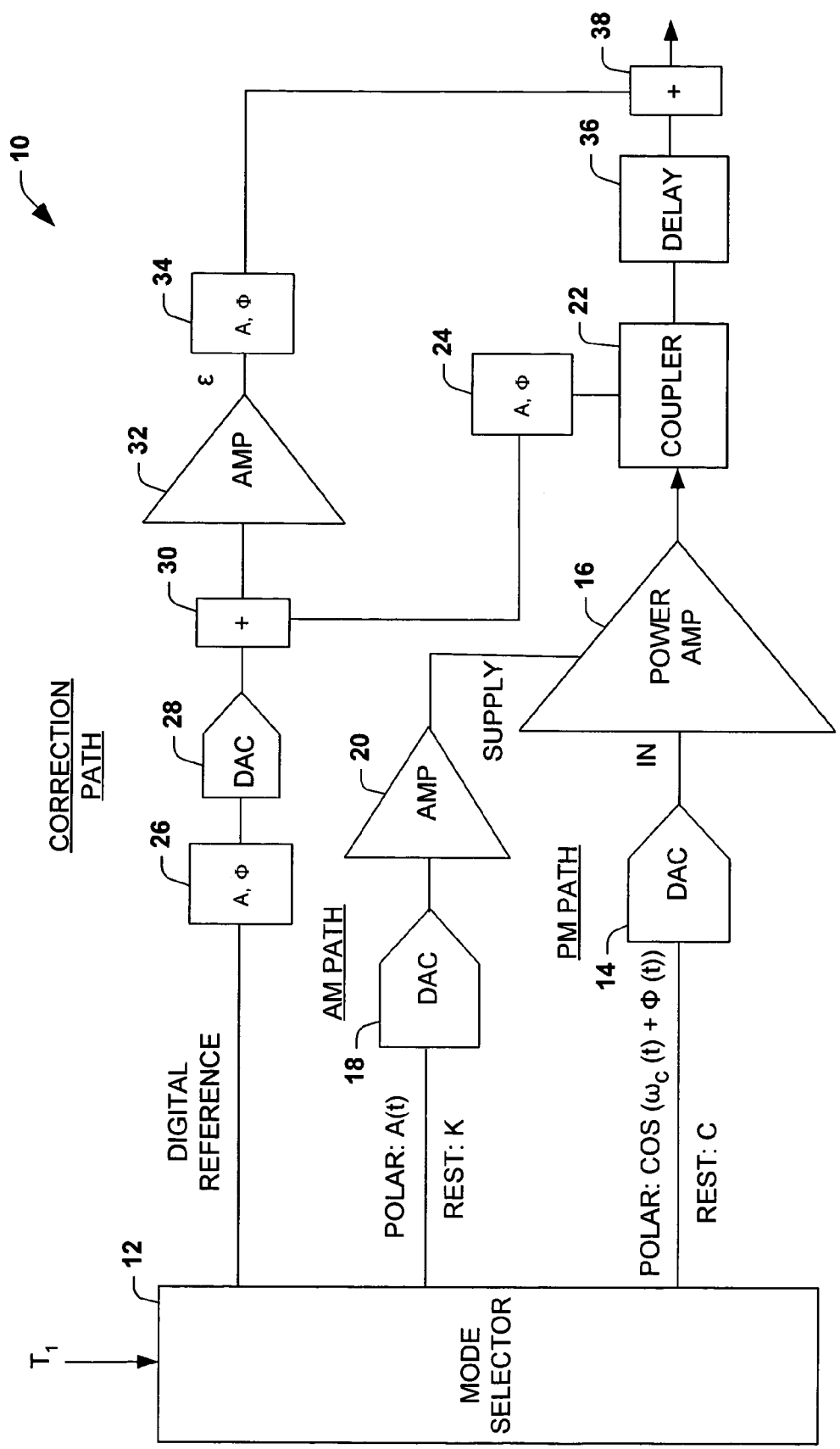
FIG. 1 illustrates a schematic block diagram of an amplifier system in accordance with an aspect of the present invention.

The present invention relates to an amplifier system that switches modes of operation based on a characteristic of an input signal relative to a threshold level (e.g., envelope amplitude level, digital count representation of signal level, power amplifier power level). The amplifier system operates as a polar amplifier system (i.e., Envelope Elimination and Restoration (EER) technique amplifier) in one mode, and operates as a linear amplifier system via a separate correction path in a restoration mode.

In one aspect of the present invention, an amplifier system is provided that includes a correction path that corrects for wanted signal distortion and/or OOB emissions in a polar mode, and provides for signal restoration in a signal restoration mode. A mode selector (e.g., a digital component) determines whether polar components ("polar mode") of the signal are sent to a power amplifier or whether constant or low level (approximately zero level) signals are provided to the power amplifier ("restoration mode"). The mode selector will apply a threshold above which the amplifier operates in polar mode. Input signals below threshold cause the mode selector to select signal restoration mode. In signal restoration mode, the correction path can be employed to restore the desired output signal, while the power amplifier is either off or operating outputting very low power levels. Polar amplifiers can cut-off and/or require an extremely rapid and difficult phase change in the constant envelope phase modulated path when the supply voltage is reduced below a critical level, as would happen when the signal crosses through a zero-amplitude point (e.g., zero crossings). Operating in polar mode, the correction path can be employed to mitigate distortion associated with amplifier components and/or signal modification techniques (e.g., peak reduction techniques).

Limiting the polar operation to signals above a selected threshold, the present invention overcomes one or more known obstacles in polar amplifier designs including synchronization of the two signal paths, large bandwidth requirements on each path, signal distortion due to large dynamic range of the input signal, signal distortion due to zero-crossings which drive the amplifier supply voltage below a critical level, and signal distortion and OOB emissions related to operating a saturated amplifier. Employing a signal restoration mode when the signal envelope is at its lower levels reduces the bandwidth required for both two signal paths in polar mode. Zero-crossings occur only in the restoration mode avoiding this problem in polar mode. The use of one or more delta-sigma DACs reduces the number of components in each path, simplifying synchronization. Employing a separate correction path during low level signals of a polar amplifier system avoids problems experienced by polar amplifiers at low supply voltages (e.g., zero crossings). Low level signals, which can be either missing or badly distorted, are restored using restoration mode, mitigating the distortion and cut off associated with a polar amplifier operating with very low supply voltage levels.

The present invention re-uses the restoration path to correct distortion and or reduce OOB emissions. It employs a digital cross-cancellation technique that supplies one or more separate reference signals to be combined with the output of the main amplifier prior to transmission. The separate reference signals enable reduced peak signal levels, correct distortion from the main amplifier signal chain, and cancel significant portions of OOB emissions in polar amplifier mode. Cancellation of OOB emissions can be accomplished by predicting and/or supplying the appropriate signals to the separate path, or by generating an undistorted or "clean" version of the wanted signal from which the error or unwanted signals are electronically derived.

Signal distortion and OOB emissions result from a number of sources including non-linearity in amplifiers, DACs, as well as from limiting or clipping of signals. When considering systems that split wanted signals into two or more components, such as polar amplifiers, additional errors can result from imperfect synchronization of signals amplified along separate paths and/or due to limitations in the bandwidth of a path. An "anti-distortion" signal can be created and combined with the signal chain prior to transmission. The difference in these two signals can be phase inverted, amplified, and combined with a delayed version of the final amplifier output signal to mitigate signal distortion and OOB emissions.

The present invention provides a technique for reducing signal distortion and suppressing OOB emissions for multi-component amplifiers that cannot be provided with feedforward (FF) systems. In conventional feedforward systems, there is a single reference signal from which to derive the cancellation signal. The present invention provides improved OOB emission cancellation and wanted signal correction over conventional FF systems, as the reference signal in the present invention can be created with fewer distortions. If the amplifier were only operated in polar mode for signals levels above threshold then low level signals would be transmitted as approximately zero levels. The absence of the low level signals would produce errors in the ensemble of transmitted signals and cause OOB emissions. The digital cross cancellation technique provides signal restoration at low signal levels (at or near zero crossings), which cause the power amplifier to cut-off and/or have enhanced distortion. This avoids the undesired errors in the wanted signals and greatly reduces the OOB emissions resulting from the "hole" in the output signal set.

The digital cross cancellation technique generates a reference signal corresponding to the wanted signal. An inverted version of the reference signal can be compared to the final amplifier output. The difference in this comparison is used to generate a cancellation signal that may be inverted, amplified, and combined with a delayed version of the final amplifier. The cancellation signal also contains, optionally, digitally computed post-correction terms and signal cancellation components to remove any signals purposefully added to the wanted signals that the system should not broadcast. Added signals could include signals to cancel peak reduction signals or calibration signals that have been introduced into the main signal path. The present invention combines techniques to reduce out-of band emissions (OOB) and wanted signal distortion due to amplifier non-linearity and reduces wanted signal peak-to-average ratio (PAR) enabling the use of smaller, lower cost amplifiers and higher efficiency architectures. Furthermore, the same reference signal can be employed to restore the wanted signal at low signal levels where the polar amplifier system cuts off or distorts.

FIG. 1 illustrates an amplifier system 10 in accordance with an aspect of the present invention. The amplifier system 10 switches operation between a polar mode and a signal restoration mode based on a characteristic of an input signal relative to a threshold level (e.g., envelope amplitude level, digital count representation of signal level, power amplifier power level). For example, the threshold level can be a selected envelope amplitude level or digital count corresponding to the envelope amplitude level. The amplifier system 10 can then operate in a polar mode for envelope amplitude levels between an envelope peak voltage and the threshold level and in a signal restoration mode for envelope amplitude levels below the threshold level. In the signal restoration mode, a separate correction path restores the wanted signal, while a main power amplifier 16 is turned "OFF", is provided with no input signal or a low level input signal and/or has the supply voltage set at a low constant low level voltage. In the restoration mode, the correction path provides the main path for the wanted signal, thus mitigating problems associated with zero crossings.

It is to be appreciated that the threshold level of the amplifier system 10 can be one or more characteristics associated with the input signal based on a desired efficiency, linearity, distortion and acceptable OOB emissions of the amplifier system 10. Additionally, the threshold level can be affected by one or more characteristics associated with amplifier system fabrication technology (e.g., Gallium Arsenide (GaAs), Indium Phosphide (InP), Gallium Nitride (GaN), Silicon (Si), Laterally Diffused Metal Oxide Semiconductors (LDMOS)). Many exemplary embodiments of the present invention will be described with respect to the threshold level being a selected envelope amplitude level for illustrative purposes. However, other characteristics associated with the input signal, the power amplifier and/or the fabrication technology can be employed to control the switching of the amplifier system between a polar mode and a restoration mode of operation.

The amplifier system 10 includes a mode selector 12 that can be a digital component (s), such as an application specific integrated circuit (ASIC), field programmable gate array (FPGA), a digital signal processor (DSP) or a combination of digital hardware and/or software components. The mode selector 12 switches the amplifier system 10 between a polar mode and a signal restoration mode based on a characteristic of the input signal relative to a threshold level $T_1$ that can be one or more fixed, selectable or programmable characteristics (e.g., envelope amplitude level) associated with the input signal. The composite signal is typically a phase and/or amplitude modulated signal which can be represented by the product of two polar components shown by the following equation:

$$A(t)COS(\omega_c(t)+\Phi(t)) \qquad \text{Eq. 1}$$

where A(t) is the amplitude modulated component and COS($\omega_c(t)+\Phi(t)$) is the phase modulated component, $\Phi(t)$ is the phase component and $\omega_c(t)$ is the carrier frequency. In polar mode, the amplitude modulated component A(t) is provided to a supply terminal of a power amplifier 16 along a amplitude modulated (AM) path, while the phase modulated component, possibly multiplied by a scalar, is provided to an input terminal of the power amplifier 16 along a phase modulated (PM) path. The input signal can be in a variety of different amplitude and/or phase modulated forms. It is to be appreciated that Eq. 1 illustrates a polar representation of a single carrier input signal, where the actual signal can be a multi-carrier signal, which has analogous amplitude modulated and phase modulated components. The "carrier frequency" might be an average or weighted average of the multiple frequencies. For example, the signal can be a signal that conforms to WCDMA, multi-carrier GSM, OFDM or other signals having similar noise like signatures with high peak-to-average (PAR) ratios. In signal restoration mode, a constant or very low level input signal (C), is provided to the input terminal of the power amplifier along the PM path and a constant supply level signal (K) is provided to the supply terminal of the power amplifier along the AM path.

The main power amplifier 16 includes an input terminal (IN) and a supply terminal (SUPPLY). The mode selector 12 has a first output coupled to the input terminal of the power amplifier 16 through a first digital-to-analog converter (DAC) 14 along the phase modulated (PM) path. The mode selector 12 has a second output coupled to a modulation amplifier 20 through a second DAC 18 along the amplitude modulated (AM) path. The output of the modulation amplifier 20 is coupled to the supply terminal of the main power amplifier 16. The modulation amplifier 20 is typically an efficient Class-S type or Class-G type modulator. The modulation amplifier 20 should be relatively efficient since the overall efficiency is proportional to efficiency of the modulation amplifier 20. It is to be appreciated that the modulation amplifier 20 can be a pulse width modulator, a switching amplifier or a linear amplifier based on desirable bandwidth and acceptable distortion limits. Low distortion is required because in polar mode the AM path carries an information bearing signal; errors in the AM signal result in errors in the power amplifier output.

The power amplifier 16 is typically a high efficiency type amplifier (e.g., Class C, D, E, F type amplifiers) where the amplifier is either switching between two levels or otherwise not conducting for an appreciable fraction of the conduction cycle. However, other less efficient amplifier types, such as linear amplifiers (e.g., Class-A, Class-AB, Class-B) can be employed. It is also to be appreciated that the power amplifier 16 can be other classes of amplifiers based on desirable bandwidth and acceptable distortion limits. The present invention is completely functional with the amplifier operating in one or more classes in each mode.

In the polar mode, the mode selector 12 transmits, with appropriate time delay, the phase modulated component $COS(\omega_c(t)+\Phi(t))$ of the composite signal in digital form to the first DAC 14. The phase modulated component has a substantially constant signal envelope. The first DAC 14 converts the phase modulated component into the analog domain, which is provided to the input terminal of the main power amplifier 16. The mode selector 12 concurrently transmits the amplitude modulated component A(t) of the composite signal in digital form to the second DAC 18. The second DAC 18 converts the amplitude modulated component A(t) from the digital domain to the analog domain. The analog amplitude modulated component is then provided to the modulation amplifier 20 which amplitude modulates the supply terminal of the power amplifier 16. The output of the power amplifier 16 is a reconstructed amplified version of the composite input signal.

A small portion of the power amplifier output is split off through a coupler 22. The coupler 22 provides an attenuated version of the power amplifier output to an amplitude and phase control component 24. The amplitude and phase control component 24 provides the attenuated signal to a summer 30. The attenuated signal is then summed with the inverted reference signal via the summer 30. The output of the summer 30 is primarily signal distortion and OOB emissions. The output of the summer 30 is amplified by a cancellation amplifier 32 to produce an cancellation signal ($\epsilon$). The cancellation amplifier 32 should be substantially linear to provide the correct signal to cancel distortion. For example, a class A or A/B amplifier that is well backed-off can be employed. Additional linearization of the cancellation amplifier 32 can be employed, including a pre-distortion system (analog or digital; the latter requiring digitizing and re-converting the signal), a feedforward loop or some other linearization technique.

The cancellation signal is inverted through an analog phase inverter 34 to provide an inverted cancellation signal. The inverted cancellation signal is recombined with a delayed version of the output of the power amplifier 16 via a delay component 36. The delay component 36 can be a cable, monolithic block, wrapped balun or transmission line to provide a small delay (e.g., nanoseconds). The inverted cancellation signal and the delayed version of the output of the power amplifier 16 are combined through a summer 38 to remove OOB emissions and reduce distortion levels. Feedback (not shown) to the DCC block to tune amplitude and phase variations can be optionally included.

The digital cross-cancellation technique in accordance with an aspect of the present invention can supply correction for amplifier distortions and it can correct spectral splatter (e.g., spectral regrowth or OOB emissions) that occurs from intentional clipping of the wanted signals performed to allow for amplifier size reduction. Additionally, since a separate digital reference signal is supplied (which can not include modifications of the wanted signal such as clipping the final output signal can be corrected without the need for additional correction information during the amplification process.

In one aspect of the invention, one or both of the first DAC 14 and the second DAC 18 are delta sigma modulated DACs. Delta Sigma modulation is a technique used to generate a coarse estimate of a signal using a small number of quantization levels and a very high sampling rate. The small number (two for a one-bit quantizer) of discrete levels introduces significant "quantization" noise into the system. The effect of oversampling and the use of an integrator feedback-loop in delta-sigma modulation are effective in shifting most of the noise to out-of-band frequencies. The noise shifting properties and introduction of quantization error enables efficient use of subsequent filtering stages to remove noise and produce a more precise representation of the input at a much higher frequency. The delta sigma DACs can be employed to convert the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range). The DCC technique will operate successfully if frequency conversion apparatus is used in any or all of the signal paths.

Furthermore, the same circuit path provided to implement the digital cross-cancellation technique provides for signal restoration at low signal levels where the power amplifier 16 has a very low supply (e.g., drain) voltage which can cause additional signal distortion and can cause the amplifier to shutoff when the supply voltage becomes too low. In the signal restoration mode, a constant input signal (C) in digital form is provided by the mode selector 12 to the first DAC 14. Alternatively, any low level signal including the phase modulated portion and/or the composite input signal can be provided to the first DAC 14. The first DAC 14 converts the input signal into the analog domain, which is provided to the input terminal of the main power amplifier 16. The mode selector 12 concurrently transmits a signal of constant amplitude K in digital form to the second DAC 18. The second DAC 18 converts the constant amplitude signal from the digital domain to the analog domain and provides the amplified version of the constant amplitude signal to the modulation amplifier 20. The modulation amplifier 20 provides an amplified version of the constant amplitude to the supply terminal of the power amplifier 16. The constant amplitude supply level K can be a substantially low supply level signal, such that signal levels provided to the power amplifier 16 in the restoration mode are at substantially low power levels. For example, an LDMOS power amplifier can be operated in the polar mode for supply voltage ranges between about 3 volts to about 25 volts. To avoid distortion and cut-off, the supply voltage can be maintained at about 3 volts in the signal restoration mode.

FIG. 2 illustrates a graph 50 of voltage versus time of an exemplary composite input signal 52. The graph 50 illustrates that the amplifier system 10 of FIG. 1 operates in a polar mode for input signal envelope amplitude levels above an envelope amplitude threshold level ET, and operates in a restoration mode for input signal envelope amplitude levels below the envelope amplitude threshold level ET. For high electrical efficiency, the envelope amplitude threshold level ET can be selected such that the input signal envelope amplitude level is above the envelope amplitude threshold level $E_T$ substantially more often than the input signal envelope amplitude level is below the envelope amplitude threshold voltage level $E_T$. Therefore, the amplifier system will operate in the polar mode substantially more often than in the restoration mode.

As illustrated in the graph 50, the amplifier system operates in the restoration mode at or near zero crossing levels of the input signal below the envelope amplitude threshold level $E_T$. Therefore, the amplifier system operates in the restoration mode at low power levels. In the restoration mode, the main amplifier can be fixed at a constant supply level or the main amplifier can be turned "OFF". The input and the output of the main amplifier are relatively insignificant since the input signal is provided along the correction path via digital cross cancellation. In the polar mode, the main power amplifier operates in the polar mode, while the correction path is employed to correct signal distortion and OOB emissions caused by amplifier components and/or peak reduction of the wanted signal.

FIG. 3 illustrates a vector diagram 60 of a quadrature phase-shift keying (QPSK) digital modulation scheme for a polar amplifier output without signal restoration. The diagram shows the signal components in a polar coordinate system where the "X" represent the phase locations of the QPSK symbols and the other traces are transitions between symbols. Different amplitude levels of the signal fill in the "X". Vector diagram 60, shows the ensemble of output signals from operation in polar mode only. A vector hole 62 shows the absence of all signals whose amplitude is below the selected threshold. As a result, information associated with the vector hole 62 of the amplified signal becomes lost and there is increasing OOB emission levels as the radius of the hole is increased.

FIG. 4 illustrates a vector diagram 70 of a quadrature phase-shift keying (QPSK) digital modulation scheme for a polar amplifier output with signal restoration. As illustrated in the vector diagram 70, the vector hole is restored. As a result, information of the amplified signal at zero crossings is not lost but restored to its original form and the OOB emissions are not increased.

Figure 5:
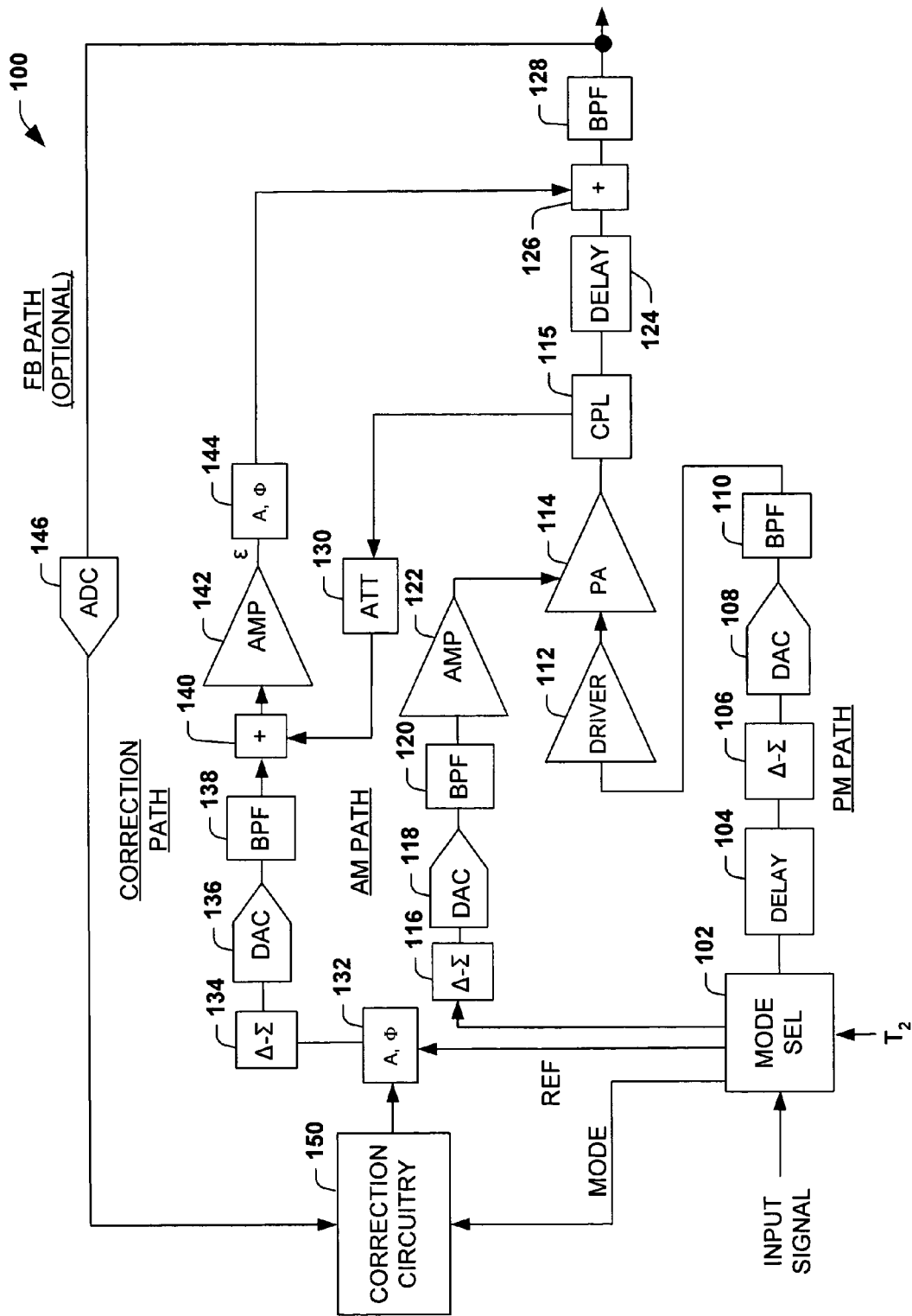
FIG. 5 illustrates a schematic block diagram of a polar amplifier system that employs a digital cross-cancellation technique in accordance with an aspect of the present invention.

FIG. 5 illustrates a polar amplifier system 100 that employs a digital cross-cancellation technique in accordance with an aspect of the present invention. The polar amplifier system 100 includes a mode selector 102 that selects between operating the amplifier system 100 in a polar mode and a signal restoration mode based on a characteristic of an input signal relative to a threshold level $T_2$. The mode selector 102 includes a polar converter that transforms the input signal into a polar representation of the input signal. The input signal is typically a phase and/or amplitude modulated signal that can be represented in polar form as illustrated in Eq. 1.

The mode selector 102 generates a first digital output signal along a phase modulated (PM) path to an input of a power amplifier 114, and a second digital output signal along an amplitude modulated (AM) path to a supply terminal of the power amplifier 114. In the polar mode, the first digital output signal is a constant envelope phase modulated component of the composite input signal, while the second digital output signal is an amplitude modulated component of the input composite signal. In the signal restoration mode, the first digital output signal can be a constant signal, can be no signal, can be a constant envelope phase modulated component of the composite signal or the composite signal, while the second digital output signal can be a fixed amplitude signal level that provides a fixed supply level to the power amplifier 114. Alternatively the fixed supply level of the power amplifier 114 can be set zero or ground essentially turning the power amplifier "OFF".

The mode selector 102 can add or remove signals to the first and second digital outputs to improve the performance of the amplifier system 100. For example, the mode selector 102 can remove peaks associated with the composite input signal and/or the amplitude modulated component of the composite signal, for example, by clipping and/or adding anti-peak signals to the signals. Additionally, the mode selector 102 can perform pre-distortion of the composite input signal and/or the phase and amplitude modulated components of the composite input signal. Alternatively, pre-distortion can be performed prior to peak removal or other distortion mitigating techniques.

The mode selector 102 also generates a third digital output signal that is a digital reference signal (REF) associated with the desired output prior to any modification of the first digital output signal and the second digital output signal. It is to be appreciated that clean reference signal can be a representation of the desired output signal or an inverted representation of the desired output signal. The form of the reference signal is appropriate to the class of amplifier 142 employed. If amplifier 142 is a linear amplifier then the reference signal is the normal composite signal.

The first digital output signal is transmitted to a delta-sigma modulator 106 through a delay component 104. The delay component 104 facilitates synchronization of the phase modulated component and amplitude modulated component, in addition to facilitating cross-cancellation of the final output signal. The delta sigma modulator 106 is coupled to a DAC 108 (e.g., 1-bit DAC, multi-bit DAC) and a band pass filter 110. The delta-sigma modulator 106, the DAC 108 and the band pass filter 110 cooperate to perform a digital-to-analog conversion directly to radio transmission frequencies. The output of the band pass filter 110 is then provided to a driver 112, which provides additional gain to the analog input signal. The output of the driver 112 is then provided to the input terminal of the power amplifier 114 for amplification. The power amplifier 114 can be a high efficiency switching type amplifier (e.g., Class C, D, E, F type amplifiers). However, other less efficient amplifier types, such as linear amplifiers (e.g., Class-A, Class-AB, Class-B) can be employed based on desired performance, acceptable efficiency and acceptable OOB emissions.

The second digital output is transmitted to a delta-sigma modulator 116. The delta sigma modulator 116 is coupled to a DAC 118 (e.g., 1-bit DAC, multi-bit DAC) and a band pass filter 120. The delta-sigma modulator 116, the DAC 118 and the band pass filter 120 cooperate to perform a digital-to-analog conversion. The output of the band pass filter 120 is then provided to a modulation amplifier 122 (e.g., Class-S, Class-G). The output of the modulation amplifier 122 is coupled to the supply terminal of the power amplifier 114 to provide the desired amplitude supply modulation in the polar mode and fixed supply level in the restoration mode.

The mode selector 102 provides the third digital signal along a correction path to a digital phase inverter 132. The third digital signal is a reference version (REF) of the input signal corresponding to the desired amplified output signal prior to any modifications or splitting into AM and PM components. Alternatively, the digital inverter 132 can be eliminated and the inverted version of the clean reference signal can be provided by the mode selector 102. The inverted clean reference signal is transmitted to a delta-sigma modulator 134. The delta sigma modulator 134 is coupled to a DAC 136 (e.g., 1-bit DAC, multi-bit DAC) and a band pass filter 138. The delta-sigma modulator 134, the DAC 136 and the band pass filter 138 cooperate to perform a digital-to-analog conversion directly to radio transmission frequencies of the inverted version of the reference signal (REF).

A small portion of the power amplifier output is split off through a coupler 115 and attenuated via an attenuator 130. The attenuated signal is summed with the inverted clean reference signal through a summer or coupler 140. The output of the summer 140 is primarily signal distortion and OOB emissions. The output of the summer 140 is amplified by a cancellation amplifier 142 to produce a cancellation signal ($\epsilon$). The cancellation signal is phase inverted through an inverter 144 to provide an inverted cancellation signal. The inverted cancellation signal is recombined with a delayed version of the output of the power amplifier 114 via a delay component 124 through a summer or coupler 126 to remove OOB emissions and reduce distortion levels in the polar mode, and to provide signal restoration in the signal restoration mode. The output of the summer 126 is then provided to an optional band pass filter 128 that filters out any remaining unwanted signals outside the desired transmission band. It is to be appreciated that the dynamic range of DAC 136 and the size of amplifier 142 will be much smaller than similar components in the PM path. The size of amplifier 142 will be determined by either the magnitude of OOB correction needed when providing DCC or by the magnitude of signal restoration required to fill in the "vector hole".

During polar mode operation, the digital cross-cancellation technique in accordance with an aspect of the present invention can supply correction for amplifier distortions and OOB emissions resulting from imperfect synchronization of the AM and PM paths, finite bandwidth effects in either path, and it can correct spectral splatter that occurs from intentional clipping of the wanted signals performed to allow for amplifier size reduction (e.g., amplifiers in the AM and PM paths are sized to according to the peak signals). Additionally, since a separate digital reference signal is employed to determine the desired correction at the output, any modification of the wanted signal can be corrected at the final output stage without the need for additional correction information during the amplification process.

During signal restoration mode operation, the digital cross-cancellation technique in accordance with an aspect of the present invention can supply correction for amplifier distortions and/or polar amplifier cut-off caused by signal at or near zero crossings. The correction path can be employed to restore the desired output signal, while the power amplifier is operating at substantially low power levels near the zero crossing points. The correction path provides the majority of the wanted signal during the signal restoration mode, such that the output of the power amplifier 114 is relatively insignificant. The supply level of the power amplifier 114 can be set at a constant level, while the input signal into the power amplifier can be set to zero or some other low power level signal, such that the correction path provides a substantial or all of the wanted signal to the output.

Optionally, a feedback loop through a feedback (FB) path can be provided to sample the output of the bandpass filter 128 of the combined signals, down convert (if needed), and digitize (e.g., with a wideband ADC 146) to examine the entire output transmission band. The feedback signal can be provided to correction circuitry 150 coupled to the phase inverter 132 to correct for errors and signal distortion associated with the correction path.

Figure 6:
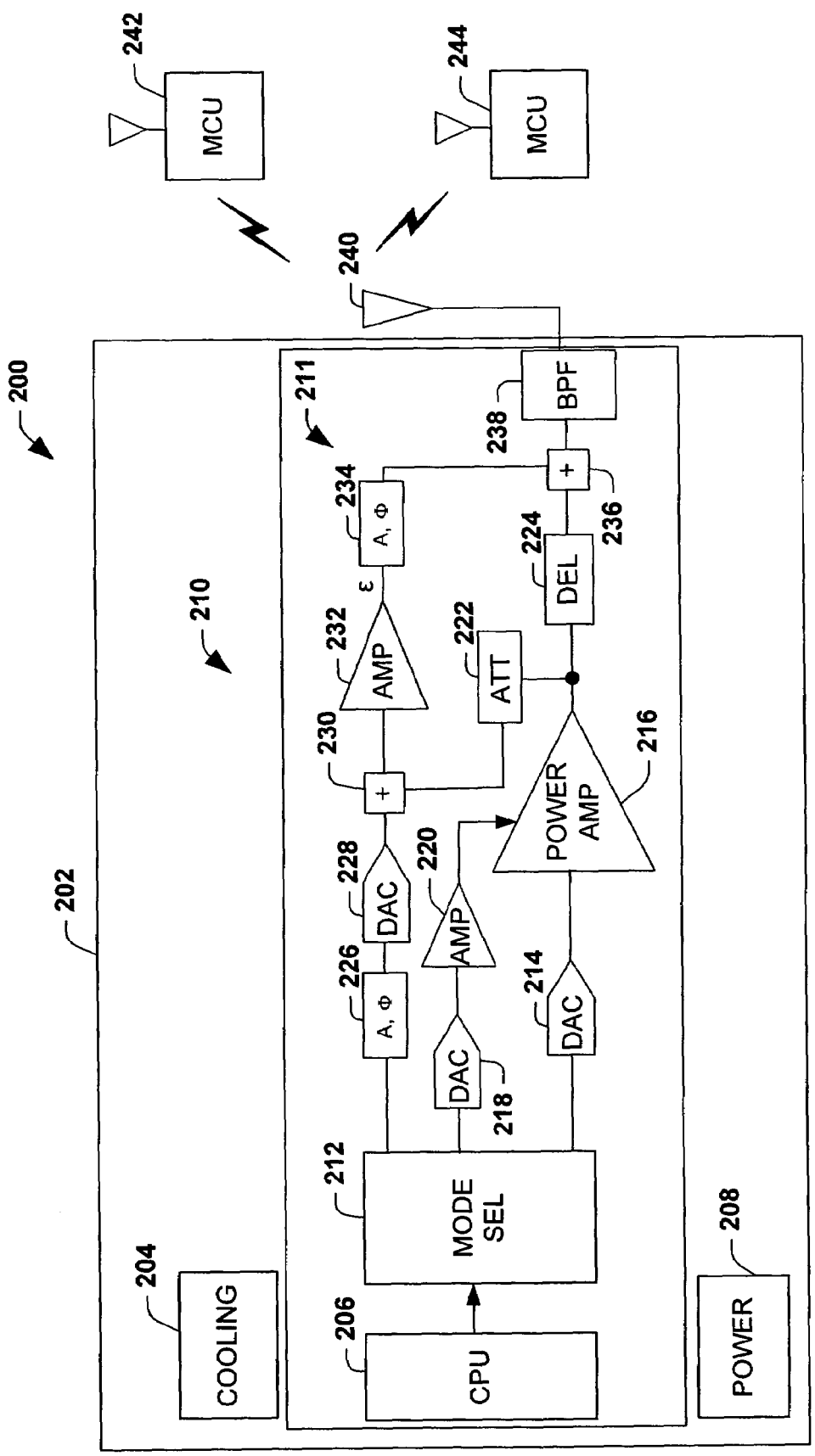
FIG. 6 illustrates a block diagram of a communication system in accordance with an aspect of the present invention.

The amplification system of the present invention can be employed in a number of applications. The amplification system can be employed in wireless transmitter applications for base stations (e.g., satellites, cellular), handsets, and other mobile communication devices. FIG. 6 illustrates a communication system 200 having a base station 202 with a transmitter 210 employing an amplifier system 211 in accordance with an aspect of the present invention. The base station 202 employs a central processing unit (CPU) to operate the base station 202 and provide an input signal to the amplifier system 211. For example, the CPU 206 can generate the type of signal (e.g., WCDMA, GSM, OFDM) to be transmitted. The base station 202 communicates to a group of mobile communication unit (MCUs) comprised of MCUs 242 and 244. The MCUs 242 and 244 are for illustrative purposes and it should be appreciated that the group of MCUs can include a greater number of MCUs based on the number of carriers in the output signal.

The base station 202 also includes cooling devices 204 and power devices 208. The power devices 208 can include AC-DC conversion and battery backup devices that protect the base station 202 from power loss failures. The power devices 208 and cooling devices 204 can be substantially reduced in size and cost compared to conventional devices since the amplifier system 211 of the present invention operates with substantially more efficiency than conventional amplifier systems. Although the base station 202 is illustrated as having a single transmitter 210, the base station 202 can have a plurality of transmitters communicating to different respective groups of MCUs over similar communication signal standards or different communication signal standards. Additionally, the MCUs 242 and 244 can also include transmitters with amplifier systems that operate similar to the amplifier system 211.

The amplifier system 211 includes a mode selector component 212 that receives an input signal from the CPU 206 and generates an input signal to a first DAC 214, a supply signal to a second DAC 218 and a clean reference signal to a third DAC 228 through a digital phase inverter 226. The input signal is converted from the digital to analog domain and provided to a power amplifier 216, and the inverted clean reference signal is converted from the digital to analog domain. A small portion of the power amplifier output is split off through an attenuator 222 and summed with the inverted clean reference signal through a summer or coupler 230. The output of the summer 230 is amplified by a cancellation amplifier 232 to produce a cancellation signal ($\epsilon$).

The cancellation signal ($\epsilon$) is inverted through an analog phase inverter 234 to provide an inverted cancellation signal. The inverted cancellation signal is recombined with a delayed version of the output of the power amplifier 216 via a delay component 224. The inverted cancellation signal and the delayed version of the output of the power amplifier 216 is combined through a summer 236. The output of the summer 236 is then provided to an optional band pass filter 238 that filters out any remaining unwanted signals outside the desired transmission band. The output of the band pass filter 238 is then transmitted across a communication link via an antenna 240.

In the polar mode, the mode selector 212 provides a phase modulated input signal to the input of the power amp 216 through the DAC 214 and an amplitude modulated supply signal to the supply of the power amplifier 216 through the DAC 218. The clean reference signal and correction path are employed to remove OOB emissions and reduce distortion levels associated with the output signal. In the signal restoration mode, the mode selector 212 provides a constant signal, no signal, a phase modulated signal or a composite signal to the input of the power amp 216 through the DAC 214, and provides a constant supply signal or no supply signal to the supply of the power amplifier 216 through the DAC 218. The clean reference signal and correction path are employed to restore the wanted signal to its original desired form.

Figure 7:
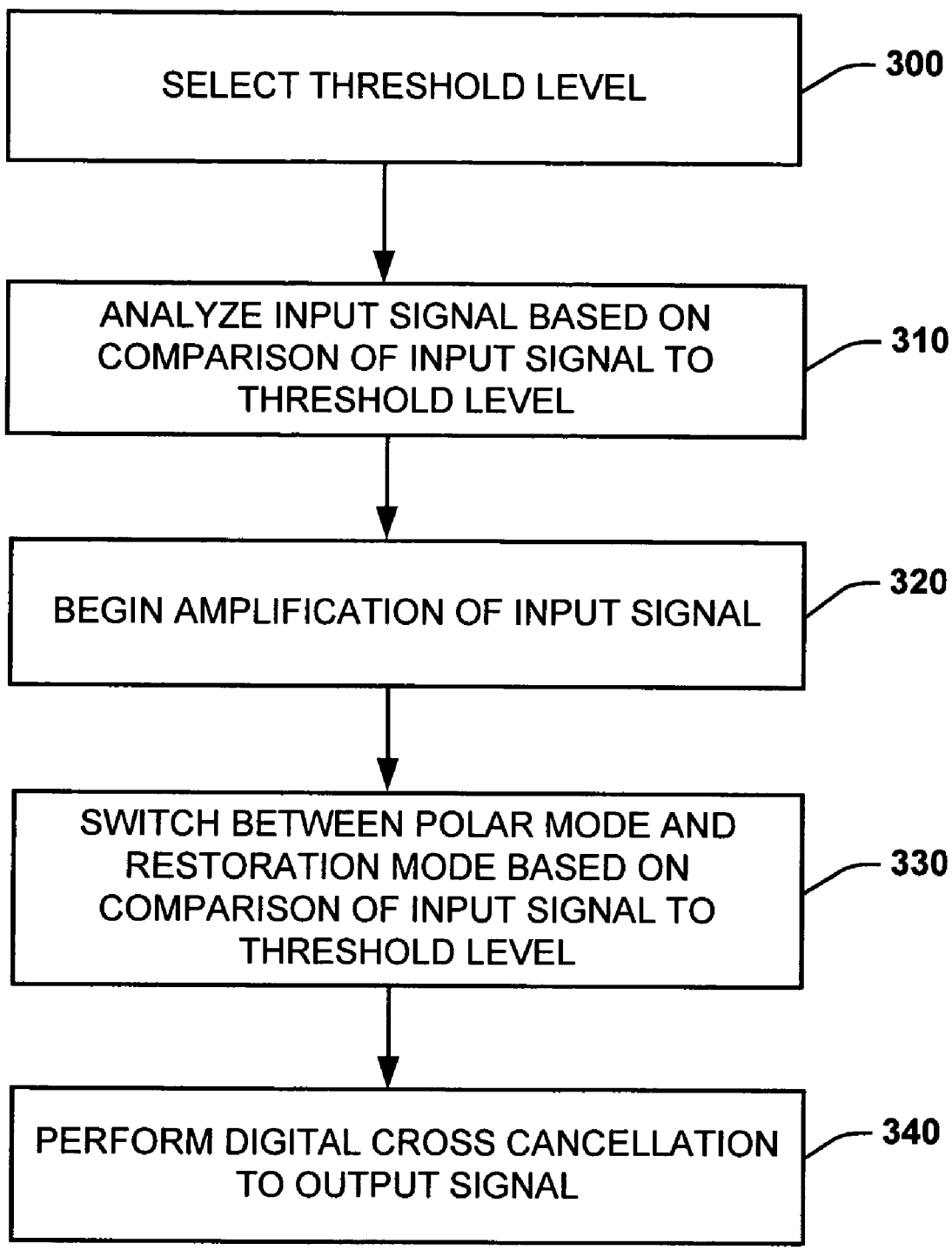
FIG. 7 illustrates a methodology for amplifying an input signal in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 illustrates a methodology for amplifying an input signal in accordance with an aspect of the present invention. The methodology begins at 300 where a threshold level is selected. The threshold level can be, for example, an envelope amplitude level in which the amplifier system operates in a polar mode for input signals having envelope amplitude levels above the threshold, but begins to distort and/or cut-off for input signal having envelope amplitude levels below the threshold level. At 310, the input signal is analyzed based on a comparison of the input signal to the threshold level. For example, the input signal can be buffered and analyzed prior to amplification. Alternatively, the input signal can be analyzed as portions of the input signal are being amplified. The input signal can be in a number of different single carrier or multi-carrier amplitude and/or phase modulated signal formats (e.g., WCDMA, GSM, OFDM).

At 320, the amplifier system begins amplifying the input signal. At 330, the amplifier system continuously switches between operation in a polar mode or a signal restoration mode based on a comparison of the input signal to a threshold level. For example, the threshold level can be a signal amplitude level and the polar mode selected for envelope amplitudes of the input signal levels above a selected envelope amplitude threshold level, and the restoration mode is selected for input signal levels below the selected envelope amplitude threshold level. It is to be appreciated that other signal characteristics can be employed to determine at which portion of the input signal that the amplifier system operates in a polar mode and at which portion of the input signal that the amplifier system operates in a restoration mode.

During the polar mode, an amplitude modulated component of the input signal is transmitted to a supply terminal of a power amplifier, and a constant envelope phase modulated component is transmitted to an input of the power amplifier. The power amplifier can be a non-linear class (e.g., Class C, D, E and F type amplifiers) or a linear class amplifier (e.g., Class A, AB and B type amplifiers). During the restoration mode, a substantially constant voltage supply signal is transmitted to the supply terminal of the power amplifier, and one of a phase modulated, component, the composite input signal, no signal and a constant signal can be transmitted to the input of the power amplifier. The power amplifier input signal and the power amplifier supply signal can be transmitted in digital format, and converted into the analog domain via respective DACs (e.g., delta-sigma modulated DACs). The amplifier supply signal is then amplified, for example, employing a Class-S or Class-G amplifier/modulator, prior to being provided to the supply terminal of the power amplifier.

At 340, digital cross-cancellation is performed on the output of the power amplifier. The digital cross-cancellation technique provides a digital reference to a separate DAC generating a "clean" version of the wanted signal. The clean version of the wanted signal is inverted and combined with an attenuated version of the actual output signal from the power amplifier to determine the unwanted portion of the output signal. The unwanted portion of the input signal is then inverted, amplified, and combined with a delayed version of the output of the power amplifier to cancel the unwanted portion from the output signal. During the polar mode, the digital cross cancellation technique mitigates distortion and OOB emissions. During the restoration mode, the digital cross cancellation technique restores the portions of the original wanted signal lost due to employing the polar mode for larger signals. The amplified and corrected signal can then be transmitted to a receiver.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplifier system comprising:
a power amplifier operative to amplify an input signal to provide an amplified output signal;
a mode selector that controls the operation of the power amplifier between a polar mode and a signal restoration mode based on a characteristic of the input signal relative to a threshold level; and a correction path that provides at least a substantial portion of the amplified output signal in the signal restoration mode.

2. The system of claim 1, the correction path mitigates signal distortion and out-of-band (OOB) emissions associated with the amplified output signal in the polar mode.

3. The system of claim 2, further comprising a feedback path from the power amplifier output to correction circuitry that mitigates errors associated with the correction path.

4. The system of claim 1, the power amplifier having an input terminal and a supply terminal, the mode selector transmits a phase modulated signal component of the input signal to the input terminal and an amplitude modulated signal component of the input signal to the supply terminal during polar mode operation, and the mode selector transmits one of a composite signal component, a phase modulated component, a constant amplitude signal and no signal to the input terminal and a substantially constant amplitude signal component to the supply terminal during signal restoration mode operation.

5. The system of claim 1, the input signal being a phase and/or amplitude modulated signal and the threshold level being an envelope amplitude level associated with the input signal, the power amplifier operates in the polar mode at input signal envelope amplitude levels above the threshold level and in a signal restoration mode at input signal envelope amplitude levels below the threshold level to mitigate distortion and power amplifier cut-off associated with zero crossings.

6. The system of claim 1, the mode selector having a first output coupled to an input terminal of the power amplifier through a first digital-to-analog converter (DAC), and a second output coupled to a supply terminal of the power amplifier through a second DAC and a modulation amplifier, the mode selector transmits digital representations of an amplifier input signal component and an amplifier supply signal component to the first and second DACs, respectively, which convert the digital representations into analog signals.

7. The system of claim 6, the mode selector having a third output coupled to a first summer through a third DAC, the first summer receives a portion of the power amplifier output through a coupler and provides a cancellation signal to a cancellation amplifier, the amplified cancellation signal is inverted and combined with a delayed version of the amplified output signal through a second summer, the third output being a digital representation of a reference signal corresponding to a desired amplified output signal.

8. The system of claim 7, at least one of the first and second DACs being delta-sigma DACs, such that the digital representations of at least one of the amplifier input signal component and the supply signal component are converted into the analog domain directly at a desired radio transmission frequency.

9. The system of claim 7, the cancellation amplifier being a linear amplifier.

10. The system of claim 6, the modulation amplifier being one of a Class-S type and a Class-G type modulator.

11. The system of claim 1, the power amplifier being a non-linear class type amplifier.

12. The system of claim 1, the mode selector generates a reference signal corresponding to a desired output signal of the amplifier system, the reference signal being combined with a portion of the output signal from the power amplifier to determine a cancellation signal, the cancellation signal being amplified, inverted and combined with a delayed version of the amplified output signal of the power amplifier to generate a final output signal.

13. The system of claim 12, the amplified inverted cancellation signal provides at least a substantial portion of the amplified output signal in signal restoration mode, and the amplified inverted cancellation signal mitigates signal distortion and out-of-band (OOB) emissions associated with the amplified output signal in the polar mode.

14. A transmitter comprising the amplifier system of claim 1.

15. A base station comprising the transmitter of claim 14.

16. An amplifier system comprising:
a power amplifier operative to amplify an input signal to provide an amplified output signal;
an input path coupled to an input of the power amplifier;
a supply path coupled to a supply of the power amplifier;
a mode selector that controls the operation of the amplifier system between a polar mode and a signal restoration mode based on an envelope amplitude level of the input signal relative to a threshold level; and
a correction path that mitigates signal distortion and out-of-band (OOB) emissions associated with the amplified output signal in the polar mode and provides at least a substantial portion of the amplified output signal in the signal restoration mode.

17. The system of claim 16, the power amplifier having an input terminal and a supply terminal, the mode selector transmits a phase modulated signal component of the input signal to the input terminal and an amplitude modulated signal component of the input signal to the supply terminal during polar mode operation, and the mode selector transmits one of a composite signal component, a phase modulated component, a constant amplitude signal and no signal to the input terminal and a substantially constant amplitude signal to the supply terminal during signal restoration mode operation.

18. The system of claim 17, the threshold level being selected to avoid excessive distortion and/or cut-off of the power amplifier due to low amplitude and/or zero-crossing portions of the input signal.

19. The system of claim 17, the input path comprising a first digital-to-analog converter (DAC) coupled to an input of the power amplifier and the supply path comprising a second DAC coupled to a modulation amplifier that is coupled to a supply of the power amplifier, the mode selector transmits digital representations of an amplifier input signal component and an amplifier supply signal component to the first and second DACs, respectively, which convert the digital representations into analog signals.

20. The system of claim 17, the correction path comprising:
a digital-to-analog converter (DAC) having an input coupled to the mode selector;
a first summer having a first input coupled to an output of the DAC and a second input coupled to an output of the power amplifier through a coupler;
a cancellation amplifier having an input coupled to an output of the first summer and an output coupled to a second summer, wherein the DAC receives a digital representation of a reference signal corresponding to a desired amplified output signal that is converted into an analog reference signal and combined with a portion of the power amplifier output through the first summer to provide a cancellation signal that is amplified by the cancellation amplifier, the amplified cancellation signal is inverted and combined with a delayed version of the amplified output signal through the second summer.

21. The system of claim 20, further comprising a first phase inverter coupled between the mode selector and the DAC and a second phase inverter coupled between the cancellation amplifier and the second summer.

22. The system of claim 17, further comprising a feedback path from the power amplifier output to correction circuitry that mitigates errors associated with the correction path.

23. An amplifier system comprising:
means for amplifying an input signal to provide an amplified output signal;
means for switching operation of the amplifier system between a polar mode and a restoration mode based on a characteristic of the input signal relative to a threshold level; and
means for correcting the amplified output signal, the means for correcting mitigating distortion and out-of-band (OOB) emissions in the polar mode and providing at least a substantial portion of the amplified output signal in the signal restoration mode.

24. The system of claim 23, the means for switching operation of the amplifier system between a polar mode and a restoration mode comprising transmitting polar components of the input signal to the means for amplifying in the polar mode and transmitting one of a composite signal component, a phase modulated component, a constant amplitude signal and no signal to an input of the means for amplifying and a substantially constant amplitude signal to a supply of the means for amplifying during signal restoration mode operation.

25. The system of claim 20, the input signal being a phase and/or amplitude modulated signal and the threshold level being an envelope amplitude level associated with the input signal, the means for amplifying operating in the polar mode at input signal envelope amplitude levels above the threshold level and in a signal restoration mode at input signal envelope amplitude levels below the threshold level to mitigate distortion and cut-off due to zero crossings associated with the input signal.

26. A method of amplifying an input signal with a power amplifier, the method comprising:
   switching a power amplifier between a polar mode operation and a signal restoration mode operation based on a characteristic of an input signal relative to a threshold level;
   transmitting a phase modulated component of the input signal to an input terminal of a power amplifier and an amplitude modulated component of the input signal to a supply terminal of the power amplifier during polar mode operation;
   transmitting one of a composite signal component, a phase modulated component, a substantially constant amplitude signal and no signal to the input terminal of the power amplifier and a substantially constant amplitude signal to the supply terminal during the signal restoration mode operation;
   amplifying the input signal via the power amplifier while continuously switching modes between polar mode operation and signal mode operation to provide an amplified output signal; and
   performing a signal correction on the amplified output signal.

27. The method of claim 26, the threshold level being an envelope amplitude level associated with the input signal, the power amplifier operates in the polar mode at input signal envelope amplitude levels above the threshold level and in the signal restoration mode at input signal envelope amplitude levels below the threshold level to mitigate distortion and power amplifier cut-off due to low amplitude signals levels and zero crossings associated with the input signal.

28. The method of claim 26, the signal correction comprising generating a separate reference signal corresponding to a desired output signal, the reference signal being combined with a portion of the output signal from the power amplifier to determine an cancellation signal, the cancellation signal being amplified, inverted and combined with a delayed version of the amplified output signal to generate a final output signal.

29. The method of claim 26, the signal correction mitigating distortion and out-of-band (OOB) emissions in the polar mode and providing at least a substantial portion of the amplified output signal in the signal restoration mode.

* * * * *